(12) United States Patent
McBride

(10) Patent No.: US 6,305,003 B1
(45) Date of Patent: Oct. 16, 2001

(54) SYSTEM AND METHOD FOR PROPAGATING CLOCK NODES IN A NETLIST OF CIRCUIT DESIGN

(75) Inventor: John G McBride, Ft Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/318,907

(22) Filed: May 26, 1999

(51) Int. Cl.[7] .................................................. G06F 17/50
(52) U.S. Cl. .............................. 716/12; 364/490
(58) Field of Search ................... 716/12, 11, 4; 364/490, 578, 489

(56) References Cited

U.S. PATENT DOCUMENTS

| | | | |
|---|---|---|---|
| 5,126,950 | * | 6/1992 | Ress et al. ........................... 364/490 |
| 5,258,919 | * | 11/1993 | Yamanouchi et al. ............... 364/489 |
| 5,550,760 | * | 8/1996 | Razdan et al. ....................... 364/578 |

\* cited by examiner

*Primary Examiner*—David Nelms
*Assistant Examiner*—Thong Le

(57) ABSTRACT

In accordance with one aspect of the invention, a method evaluates an element of the netlist, and ensures that a gate node of the element is defined as a clock node. Then, the method determines whether a first channel node of the element has already been designated as a clock node. If not, the method determines that the clock signal should be propagated through the element, and marks the first channel node as a clock node. Thereafter, the method evaluates another element that is gate connected to the first channel node, and repeats the above-listed steps on the another element. In accordance with another aspect of the invention, a method evaluates an element of the netlist, ensures that a gate node of the element is defined as a clock node, ensures that a channel node (either source or drain) of the element is not a precharge node, and ensures that the channel node of the element is not a predischarge node. In accordance with yet another aspect of the invention, the method evaluates a logic gate, wherein the gate node of the FET element is the input of the logic gate. In accordance with this aspect, the method determines an output node of the logic gate, ensures that the output node is not a precharge node, and ensures that the output node of the gate is not a predischarge node.

16 Claims, 15 Drawing Sheets

ELEMENT { ~~~~

~~~~

Pass FET
Feedback Element
~~~~

NODE { ~~~~

~~~~

Clock
Precharge Node
Static Gate Output
Interstitial Precharge Node
Predischarge Node
~~~~~

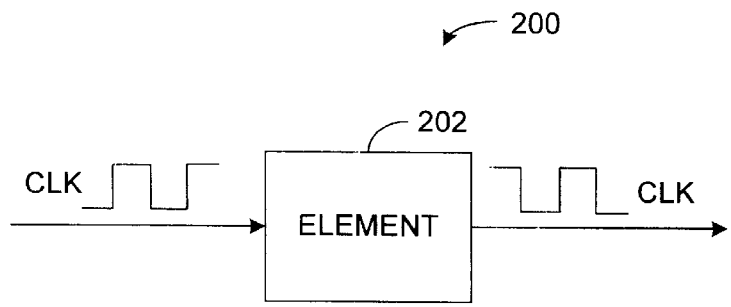
FIG. 5A
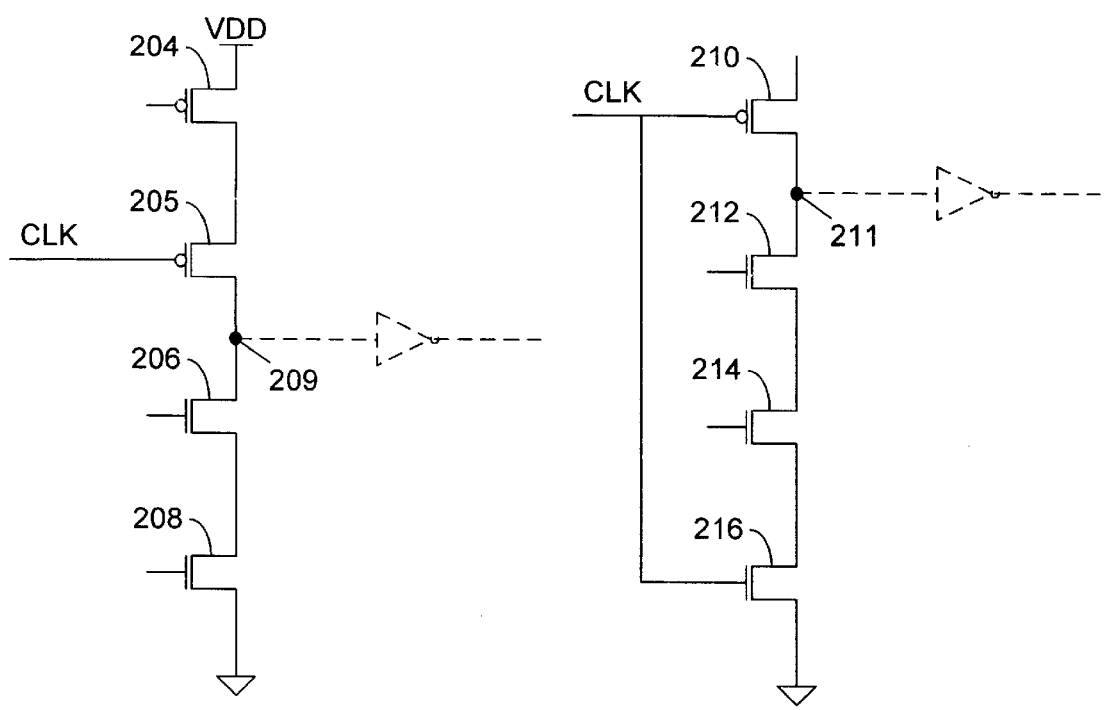
FIG. 6A   FIG. 6B

SYSTEM AND METHOD FOR PROPAGATING CLOCK NODES IN A NETLIST OF CIRCUIT DESIGN

BACKGROUND OF THE INVENTION

1. Field of the Invention

The present invention generally relates to computer-aided circuit design systems, and more particularly to a system and method for evaluating a netlist of an integrated circuit to propagate clock nodes throughout the circuit design.

2. Discussion of the Related Art

Integrated circuits are electrical circuits comprised of transistors, resistors, capacitors, and other components on a single semiconductor "chip" in which the components are interconnected to perform a given function such as a microprocessor, programmable logic device OLD), electrically erasable programmable memory (EEPROM), random access memory (RAM), operational amplifier, or voltage regulator. A circuit designer typically designs the integrated circuit by creating a circuit schematic indicating the electrical components and their interconnections. Often, designs are simulated by computer to verify functionality and ensure performance goals are satisfied.

In the world of electrical device engineering, the design and analysis work involved in producing electronic devices is often performed using electronic computer aided design (E-CAD) tools. As will be appreciated, electronic devices include electrical analog, digital, mixed hardware, optical, electro-mechanical, and a variety of other electrical devices. The design and the subsequent simulation of any circuit board, VLSI chip, or other electrical device via E-CAD tools allows a product to be thoroughly tested and often eliminates the need for building a prototype. Thus, today's sophisticated E-CAD tools may enable the circuit manufacturer to go directly to the manufacturing stage without costly, time consuming prototyping.

In order to perform the simulation and analysis of a hardware device, E-CAD tools must deal with an electronic representation of the hardware device. A "netlist" is one common representation of a hardware device. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often a netlist will contain a number of circuit "modules" which are used repetitively throughout the larger circuit. A flat netlist will contain multiple copies of the circuit modules essentially containing no boundary differentiation between the circuit modules and other components in the device. By way of analogy, one graphical representation of a flat netlist is simply the complete schematic of the circuit device.

In contrast, a hierarchical netlist will only maintain one copy of a circuit module which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component whose inputs, outputs, and general function are known, but whose contents are not shown. These "black box" representations, hereinafter called "modules", will mask the complexities therein, typically showing only input/output ports.

An integrated circuit design can be represented at different levels of abstraction, such as the Register-Transfer level (RTL) and the logic level using a hardware description language (EDL). VHDL and Verilog are examples of HDL languages. At any abstraction level, an integrated circuit design is specified using behavioral or structural descriptions or a mix of both. At the logical level, the behavioral description is specified using Boolean equations. The structural description is represented as a netlist of primitive cells. Examples of primitive cells are full-adders, NAND gates, latches, and D-Flip Flops.

Having set forth some very basic information regarding the representation of integrated circuits and other circuit schematics through netlists, systems are presently known that use the information provided in netlists to evaluate circuit timing and other related parameters. More specifically, systems are known that perform a timing analysis of circuits using netlist files. Although the operational specifics may vary from system to system, generally such systems operate by identifying certain critical timing paths, then evaluating the circuit to determine whether timing violations may occur through the critical paths. As is known, timing specifications may be provided to such systems by way of a configuration file.

One such system known in the prior art is marketed under the name PathMill, by EPIC Design Technology, Inc. (purchased by Synopsys). PathMill is a transistor-based analysis tool used to find critical paths and verify timing in semiconductor designs. Using static and mixed-level timing analysis, PathMill processes transistors, gates, and timing models. It also calculates timing delays, performs path searches, and checks timing requirements. As is known, PathMill can analyze combinational designs containing gates, and sequential designs containing gates, latches, flip-flops, and clocks. Combinational designs are generally measured through the longest and shortest paths.

While tools such as these are useful for the design verification process after layout, there are various shortcomings in the PathMill product and other similar products. For example, there is often a need to identify certain logic gates or particular combinations of logic gates. When evaluating certain circuit configurations, it is sometimes helpful to know whether a given node is a clock node (i.e., a node that carries a clock signal) or not. PathMill may be configured to evaluate a netlist file and identify certain nodes as clock nodes. However, PathMill only identifies certain nodes, but not all nodes as clock nodes within a netlist file, but does not identify all clock nodes.

Accordingly, there is a need to provide a system and method for evaluating a netlist file to propagate clock signals throughout a circuit defined by the netlist.

SUMMARY OF THE INVENTION

Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the advantages and novel features, the present invention is generally directed to a system and method for evaluating a netlist, identifying one or more clock nodes, and propagating properties associated with those nodes throughout the circuit design defined by the netlist file. In accordance with one aspect of the invention, a method evaluates an element of the netlist, and ensures that a gate node of the element is defined as a clock node. Then, the method determines whether a first channel node of the element has already been designated as a clock node. If not, the method determines that the clock signal should be propagated through the element, and marks the first channel node as a clock node. Thereafter, the method evaluates another element that is gate connected to the first channel node, and repeats the above-listed steps on the another element.

In accordance with another aspect of the invention, a method determines that a clock signal should be propagated through an element by evaluating the element of the netlist, ensuring that a gate node of the element is defined as a clock node, ensuring that a drain node of the element is not a precharge node, ensuring that the drain node of the element is not a predischarge node, ensuring that a source node of the element is not a precharge node, and ensuring that the source node of the element is not a predischarge node.

In accordance with one embodiment, the above-described method further ensures that the source node of the element is not a supply node, ensures that the source node of the element is channel connected to both an NFET and a PFET, marks the source node as a clock node, and evaluates another element that is gate connected to the source node. Each of the above-listed steps is then repeated on the another element. In addition, the embodiment may further ensure that the drain node of the element is not a supply node, ensure that the drain node of the element is channel connected to both an NFET and a PFET, mark the drain node as a clock node, and evaluate another element that is gate connected to the drain node.

In accordance with yet another aspect of the invention, the method evaluates a logic gate, wherein the gate node of the FET element is the input of the logic gate. In accordance with this aspect, the method determines an output node of the logic gate, ensures that the output node is not a precharge node, and ensures that the output node of the gate is not a predischarge node.

DESCRIPTION OF THE DRAWINGS

The accompanying drawings incorporated in and forming a part of the specification, illustrate several aspects of the present invention, and together with the description serve to explain the principles of the invention. In the drawings:

FIG. 4A is a diagram illustrating a portion of a data structure of a circuit element, depicting certain flags that may be set, in accordance with the invention;

FIG. 4B is a diagram illustrating a portion of a data structure of a circuit node, depicting certain flags that may be set, in accordance with the invention;

FIG. 5A is a block diagram illustrating the top-level concept of propagating a clock signal through a circuit element, in accordance with the present invention;

FIG. 6A is a schematic diagram of a circuit configuration that propagates a clock signal, in accordance with the present invention;

FIGS. 6B–6D are schematic diagrams of similar circuit configurations that do not propagate a clock signal, in accordance with the present invention;

DETAILED DESCRIPTION OF THE PREFERRED EMBODIMENT

Figure 1:
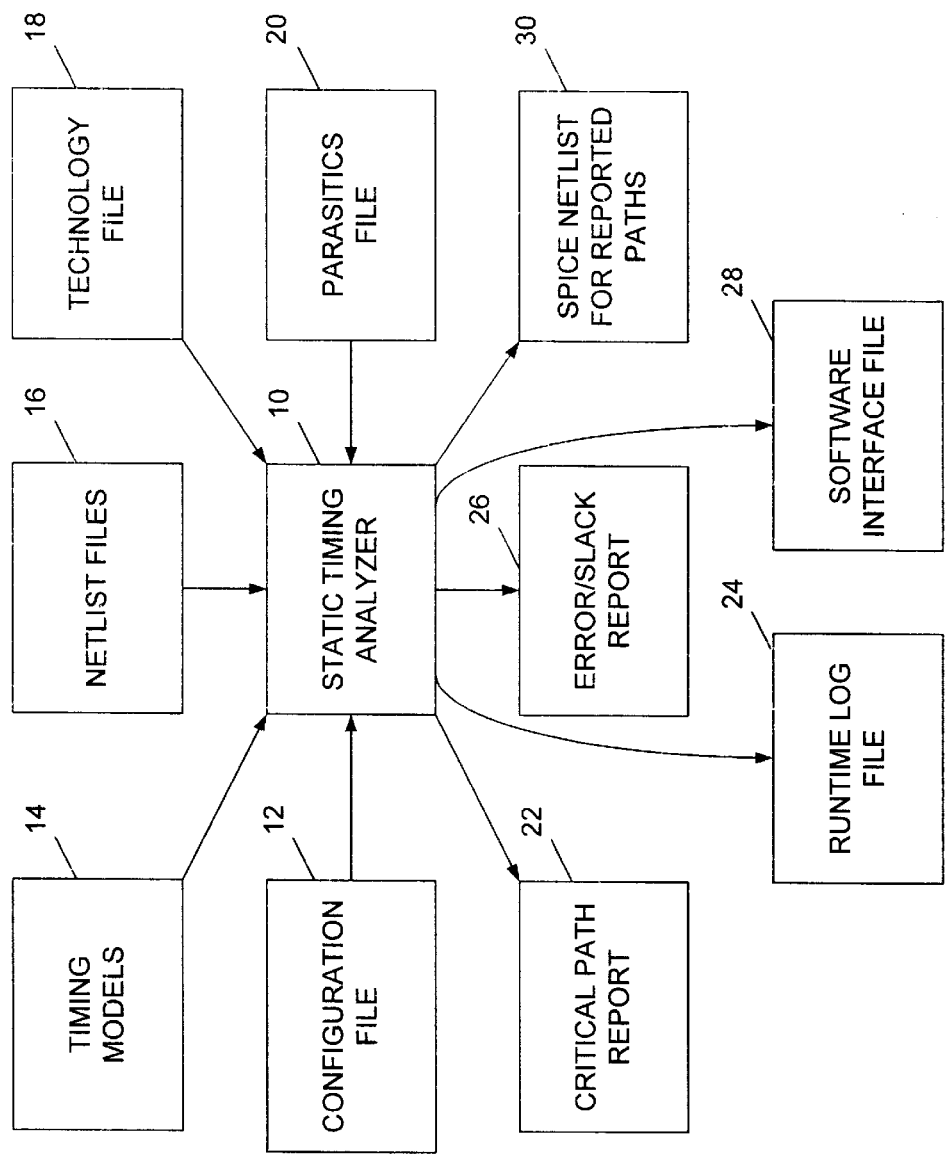
FIG. 1 is a block diagram of a static timing analyzer system, as is known in the prior art.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Referring now to the drawings, reference is made to FIG. 1, which is a block diagram of a prior art static timing analyzer program that illustrates the basic informational flow in such a system. Specifically, and as previously mentioned, one such system is marketed under the name PathMill FIG. 1 is a diagram that illustrates the informational flow in the PathMill system. At the center of the diagram is a block denoted as Static Timing Analyzer 10, which represents the PathMill program. Surrounding this block 10 are a number of other blocks that represent various input and output files and/or information.

More particularly, the PathMill program may utilize a configuration file 12, a file of timing models 14, one or more netlist files 16, a technology file 18, and a parasitics file 20, for various input information. In addition, the PathMill program may generate a number of different output files or other output information, including a critical path report 22, a runtime log file 24, an error report 26, a software interface file 28, and a SPICE netlist 30. When started, the PathMill program first processes the input netlist file(s) 16, the technology file 18, and the configuration files 12. The information from these files is subsequently used for performing path analyses. Since the PathMill program is publicly available and marketed, its function and operation are well known, and therefore need not be discussed in detail herein.

For purposes of illustrating the present invention, much of the diagram and information illustrated in FIG. 1 is not shown in connection with the inventive system. In this regard, reference is made to FIG. 2, which shows one embodiment of a system constructed in accordance with the present invention. In the illustrated embodiment, only the static timing analyzer 10, the configuration file 12 and the netlist file 16 of FIG. 1 are shown. The configuration file(s) 12 contains information that informs the static timing analyzer 10 how to perform its analysis, and various numbers of configuration files may be used. The netlist file 16, as is known, defines the various integrated circuit components, and their interrelations. The static timing analyzer 10 may make its internal database or netlist available to the electrical rules checker, which in turn may generate a binary file output 106.

The electrical rules checker 100 program of the present invention is preferably configured to operate on an output of the static timing analyzer 10. In this regard, the static timing analyzer may be configured to generate an output netlist database, which the electrical rules checker of the present invention utilizes as an input. As previously mentioned, there are a wide variety of reasons why an electrical rules checking program may be desired. One such reason is to perform various checks over certain rules or strategies in an integrated circuit design. Such rules may vary from circuit to circuit, depending upon the particular application. A portion 102 of the electrical rules checker program 100 of the preferred embodiment of the present invention operates to evaluate a netlist file and propagate certain identified clock nodes to all appropriate nodes. The identification of such a circuit configuration may be used to exempt an error message (or warning) that would otherwise be generated upon detecting multiple gates configured to drive a common node.

As is known, a large scale integrated circuit design is often done at the FET level. A designer may utilize thousands of interconnected FETs in designing a portion of an integrated circuit. Although the designer may make every effort to follow certain design guidelines, mistakes may nevertheless be made. Accordingly, the electrical rules checker of the present invention provides an excellent mechanism for double-checking designs and design layouts.

Figure 2:
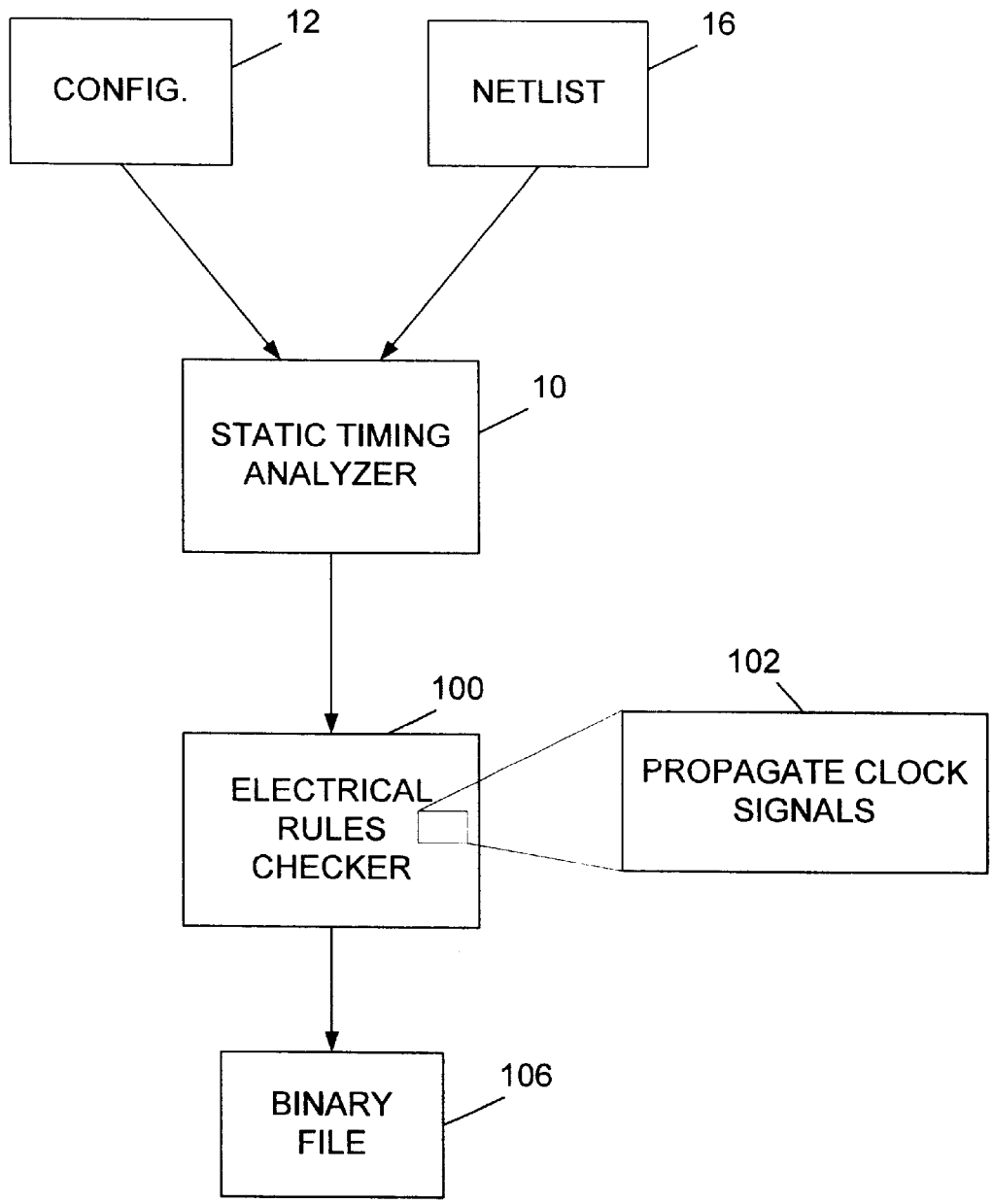
FIG. 2 is a block diagram illustrating the orientation of the electrical rules checking method of the present invention, in relation to an existing static timing analyzer.

In keeping with the description of FIG. 2, the electrical rules checker 100 of the present invention may generate an output binary file 106, which may ultimately be used in subsequent executions of the electrical rules checker program 100.

However, prior to the electrical rules checker 100 of the present invention performing any of the rules checking tasks, a database of nodes and elements of the circuit to be evaluated is generated. This database is then utilized by the electrical rules checker 100 of the present invention to perform the rules checking tasks. However, it should be noted that the database and the method in which it is generated is not limited to use with any particular rules checker. They may be used with virtually any type of rules checker which evaluates nodes for design quality. For example, the database of the present invention may also be used with rules checkers which evaluate nodes for optical computing systems, mechanical systems and chemical systems. It will be apparent to those skilled in the art how data structures similar to those generated for elements and nodes in the electrical context may be generated in mechanical, chemical and optical computing contexts and used for rules checking in those contexts.

The manner in which this database is generated will now be discussed below with respect to FIGS. 3A–3C. For purposes of illustration, it will be assumed that the static timing analyzer 10, shown in FIG. 2 and discussed above, is the PathMill static timing analyzer, in order to provide an example of one possible implementation of the present invention. However, those skilled in the art will understand that the electrical rules checker 100 of the present invention and the database of the present invention are not limited to use with any particular program.

The PathMill static timing analyzer provides an application program interface (API) which allows the PathMill static timing analyzer to communicate with the electrical rules checker 100 of the present invention. This API allows code external to the PathMill program to be linked to the PathMill program so that the external code and the PathMill program itself comprise one executable which can be run as a single program. The electrical rules checker 100 of the present invention utilizes this API to obtain information from the PathMill static timing analyzer which can be utilized by the electrical rules checker 100 to generate the database of the present invention, as indicated by block 102.

Prior to the database of the present invention being generated, the PathMill program runs and identifies circuit characteristics of the circuit under consideration such as, for example, FET direction, node types, latches, dynamic gates, clocks, rise and fall times, etc. Before the PathMill program terminates, it calls the electrical rules checker 100 of the present invention. The PathMill program has a feature commonly referred to as "hooks", which allows the PathMill program to call routines at various stages of execution. Once the PathMill program has finished identifying the characteristics mentioned above, the PathMill program calls the electrical rules checker 100 of the present invention. The electrical rules checker 100 of the present invention, through this series of subroutine calls, creates its own database of the circuit under consideration.

Figure 3A:
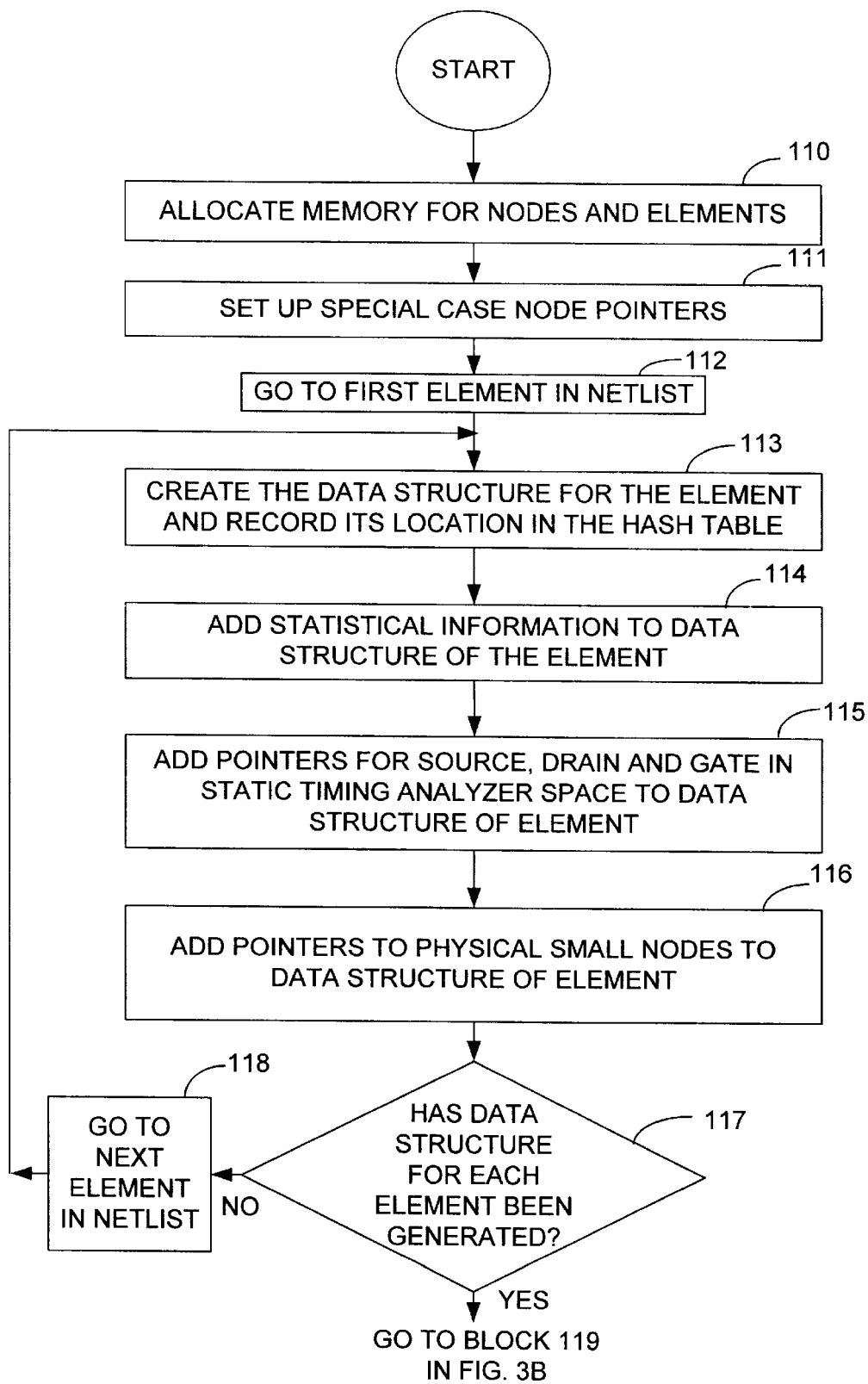
FIGS. 3A–3C collectively depict a flowchart that illustrates a process of generating a database of certain circuit element and node characteristics and properties that my be utilized by the preferred embodiment of the present invention to identify nodes susceptible to floating.
Figure 3B:
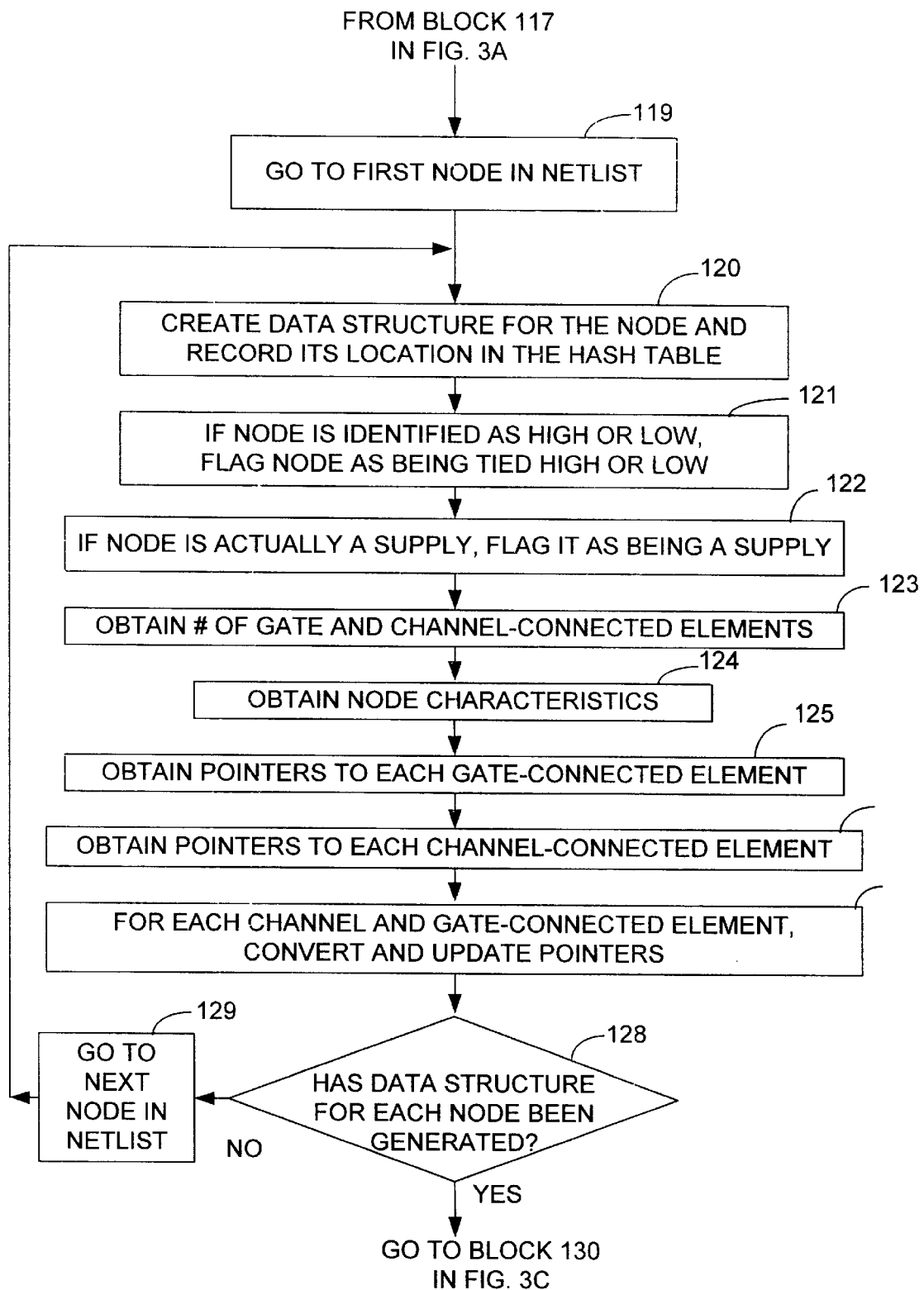

The first step in the process of generating the database is to allocate memory for the nodes and elements of the circuit, as indicated by block 110 in FIG. 3A. The PathMill program provides information via its API about the number of elements and nodes in the circuit of the electrical rules checker 100 and this information is utilized by the electrical rules checker 100 to perform memory allocation. Certain types of nodes and elements do not require as much information about their characteristics as do other types of nodes and elements. Therefore, the amount of memory allocated may vary for different types of nodes and elements. Rather than merely basing memory allocation on the number of nodes and elements in the circuit, it may be desirable to distinguish between different types of nodes and elements so that memory can be more efficiently allocated. However, it will be apparent to those skilled in the art that the present invention is not limited with respect to the manner in which memory space is allocated for the nodes and elements. Those skilled in the art will understand the manner in which the memory allocation task, and any optimizations of it, can be performed. Therefore, in the interest of brevity, a detailed discussion of the memory allocation task for the nodes and elements will not be provided herein.

Once memory has been allocated for the nodes and elements, the next step in the process of the present invention is to set up node pointers for special cases of nodes, as indicated by block 111. These special types of nodes will be used repeatedly during the process of generating the database, as discussed below in more detail. Therefore, the pointers for these nodes preferably are set up relatively early in the database generation process. For example, nodes which correspond to the supplies (GND and VDD) are special types of nodes and it is helpful to set up node pointers for these types of nodes. This is done by finding the nodes whose names match the known names of the supply nodes.

For each element, a data structure must be generated which can be utilized by the electrical rules checker 100 in performing the rules checking tasks. Steps 113–116 in FIG. 3A correspond to the steps for creating the element data structures. The first element for which a data structure must be generated is obtained during the step represented by block 112. The data structure for that element is then generated and the location of the data structure is recorded in a hash table, as indicated by block 113. This step is performed so that the element pointers into the space of the static timing analyzer can be used later to look up the element data structures in the space of the electrical rules checker 100. Hash tables and the manner in which they are utilized are well-known in the art. Therefore, a detailed discussion of the manner in which the pointers into the space of the static timing analyzer are converted using the hash table into pointers into the space of the electrical rules checker 100 will not be provided herein since persons skilled in the art will understand the manner in which this can be accomplished.

Statistical information relating to the element is then added to the data structure of the element, as indicated by block 114. This information includes, for example, the width of the element, the length of the element, the direction of the element, and the element type. Once the statistical information has been included in the data structure of the element, the pointers for the source, drain and gate of the element, as defined in the space of the static timing analyzer, are included in the data structure of the element, as indicated by block 115. The pointers that were set up in step 111 are utilized in step 115. If either the source, drain or gate of the element is attached to ground or VDD, then the pointers for the source, drain and gate are set to the pointers for ground or VDD obtained in step 111.

A circuit and the nodes of the circuit can be represented logically or physically, or as a combination of both. A logical representation of a circuit primarily comprises FETs and does not include any resistors for representing parasitic resistance of the interconnect material. The logical representation of a node is identified in the PathMill program as a "supernode". On the other hand, a physical representation of a node, which is identified in the PathMill program as a "small node", includes FETs, but also includes resistors, which correspond to the parasitic resistance in the node. Therefore, in the physical representation, a small node exists between the resistors representing the parasitic resistance and between any FET and any one of the resistors. In the physical representation, FETs may be connected to different small nodes whereas in the logical representation, those same FETs may be connected to the same supernode.

Each element has a pointer to a supernode and to a small node for each drain, source and gate. Therefore, there are six pointers for each FET. Each small node in the physical representation maps to one particular supernode in the logical representation. In block 116, the pointers corresponding to these small nodes are added to the data structure of the element. A determination is then made at block 117 as to whether or not data structures for all of the elements have been generated. If not, the next element in the netlist is obtained, as indicated by block 118, and the process returns to block 113. If so, the process proceeds to block 119 in FIG. 3B.

Once the data structures for the elements have been generated, the data structures for the nodes must be generated. Blocks 120–127 in FIG. 3B correspond to the steps in the process of the present invention for generating the data structures of the nodes. The first node for which the data structure is to be generated is obtained at the step represented by block 119. The data structure for the node is then generated and the location of the data structure is recorded in the hash table, as indicated by block 120.

For the purpose of design quality analysis, it is important to distinguish actual supply nodes, such as VDD and GND, from other circuit nodes which have been declared to be tied high or low for the purpose of timing or other analysis. In block 121, the rules checker 100 determines, through the use of PathMill API calls, which nodes have been declared to be tied high or low, or are actually high or low because they are actual supply nodes. The rules checker 100 flags the actual high nodes as high and the actual low nodes as low in the step represented by block 121. In the step represented by block 122, the nodes which are actually supplies are flagged as supplies in the database.

The electrical rules checker 100 then obtains the number of gate-connected elements and the number of channel-connected elements from the static timing analyzer, as indicated by block 123. The electrical rules checker 100 also obtains the characteristics of the nodes from the static timing analyzer 10, as indicated by block 124. These characteristics include, for example, capacitance, node type, rise and fall time, etc. Once the characteristics of the node have been obtained, the electrical rules checker 100 obtains the pointers provided by the static timing analyzer 10 that point to each gate-connected element, as indicated by block 125. The electrical rules checker 100 then obtains the pointers from the static timing analyzer which point to each channel-connected element, as indicated by block 126.

The element pointers that are stored in the node during the steps represented by blocks 125 and 126 are pointers into the space of the static timing analyzer. Similarly, the node pointers that are stored in the element during the step represented by block 115 are pointers into the space of the static timing analyzer, except that the pointers to the VDD and GND nodes are stored as pointers to the VDD and GND nodes in the space of the electrical rules checker 100. In the step represented by block 127, some of these pointers are converted to point to the elements and nodes in the space of the electrical rules checker 100. For each of the gate-connected and channel-connected elements of the current node, the following steps are performed, which are represented by block 127:

(1) the element pointer is converted to the corresponding element pointer into the space of the electrical rules checker 100 by looking it up in the hash table. This element pointer replaces the original element pointer in the node structure;

(2) the source, gate, and drain pointers in the element data structure are each checked to see if they point to the current node. If so, the node pointer (into the space of the static timing analyzer) is replaced with the pointer to the current node in the space of the electrical rules checker.

A determination is then made at block 128 as to whether or not data structures for all of the nodes have been generated. If not, the next node in the netlist is obtained, as indicated by block 129, and the process returns to block 120.

Figure 3C:
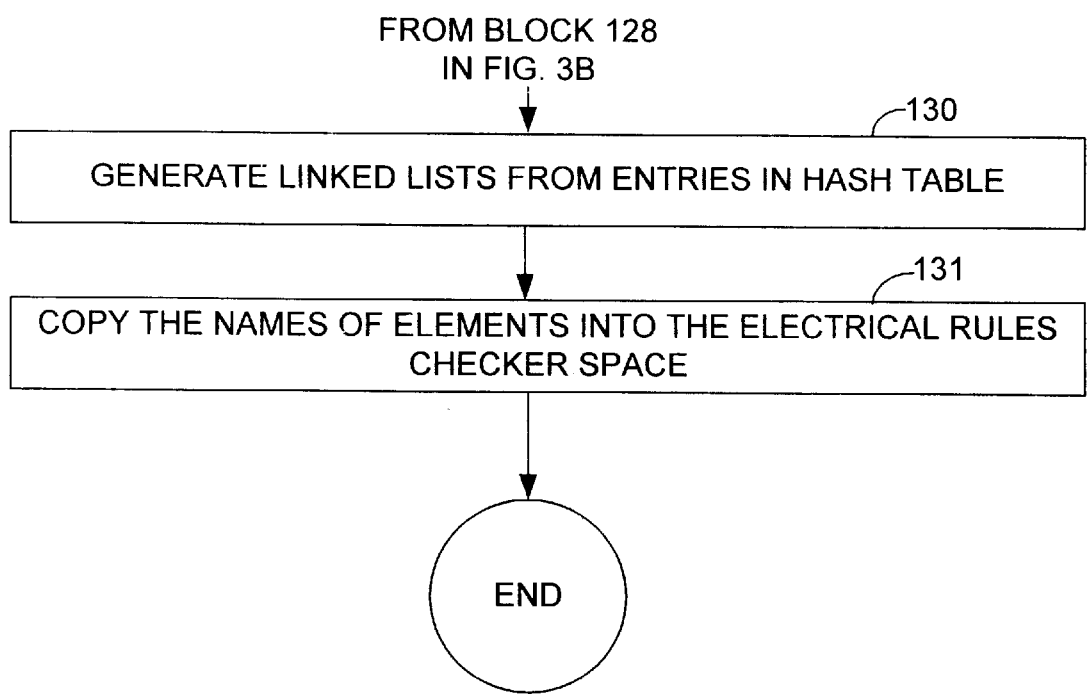

In order to enable the electrical rules checker 100 to maximize efficiency in searching the database of the present invention, once the data structures for all of the nodes have been created, linked lists of elements and nodes are generated from the entries in the hash table, as indicated by block 130 in FIG. 3C. These lists are used by the electrical rules checker 100 of the present invention in searching for an element in the database of the present invention. When searching for an element, the electrical rules checker 100 simply analyzes the elements contained in the linked list.

It should be noted that the arrangement of the elements and nodes in the linked fists may or may not have any physical relationship to the arrangement of the elements and nodes in the circuit under consideration. Thus, the linked lists are merely used to search through the elements and nodes stored in the database.

Once the linked lists have been generated, the names of the elements and nodes contained in the linked list are copied into electrical rules checker space, as indicated by block 131. This reduces the number of calls that need to be made to the PathMill program by the electrical rules checker 100. Once the database of the present invention has been generated, no more calls have to be made to the PathMill program via the PathMill API. The database of the present invention is comprised as the binary file 106 shown in FIG. 2.

The database that is generated may be structured so that various element and node features may be accessed via a data structure. Indeed, both an element data structure and a node data structure may be defined. As illustrated in FIG. 4A, the element data structure may define a large number of parameters (or flags), including whether the current element is a pass FET, a feedback FET, etc.. Similarly, a node data structure may be defined and include a number of flags, including a flag that indicates whether the node is a clock node, a precharge node, a static gate output node, an interstitial precharge node, a predischarge node, etc..

Once the database of the present invention has been generated in the manner described above, the electrical rules checker 100 of the present invention utilizes this database to perform the rules checking tasks. As previously mentioned, one such task, and the one performed by the present invention involves the propagation of clock signals throughout a circuit design. Specifically, the present invention evaluates elements in a netlist file to determine whether the elements receive a clock signal on an input. If so, then the invention evaluates the circuit element, and surrounding circuitry if appropriate, to determine whether the input clock signal should be propagated to the output of the element. During this process certain features, attributes, or parameters of circuit elements or nodes are utilized. Consistent with the broader concepts of the present invention, these features, attributes, or parameters, may be determined "on the fly", may be specified by a designer, or may be predetermined and stored in a database structure (e.g., FIGS. 4A and 4B) for later retrieval and use.

Having described certain environmental and other background system information, the discussion will now be directed toward the inventive aspects of the present invention. In this regard, one aspect of the present invention is to provide a method for propagating clock nodes throughout a netlist file defining a circuit. To more particularly illustrate, reference is made to FIG. 5, which is a diagram 200 that illustrates the top-level concept of the present invention. Specifically, a circuit element 202 is illustrated having an input and at least one output. If the input is identified, or predetermined, to carry a clock signal, then the present invention evaluates the configuration of the circuit element 202 and surrounding components (not shown) to determine whether the clock signal is propagated through the circuit element 202. If it is determined by the invention that the clock signal does, indeed, propagate through the circuit 202, then one or more of the output signals will be marked, or labeled, by the invention as carrying a clock signal. It will be appreciated by persons skilled in the art that some clock signals may be identified by certain circuit configurations, by specification from a designer, or otherwise may be pre-identified or predetermined. In this regard, PathMill attempts to identify and designate at least some clock signals within a circuit design. Recognizing these pre-identified clock signals, the present invention propagates these signals throughout the circuit design of a netlist, where appropriate.

Figure 6C:
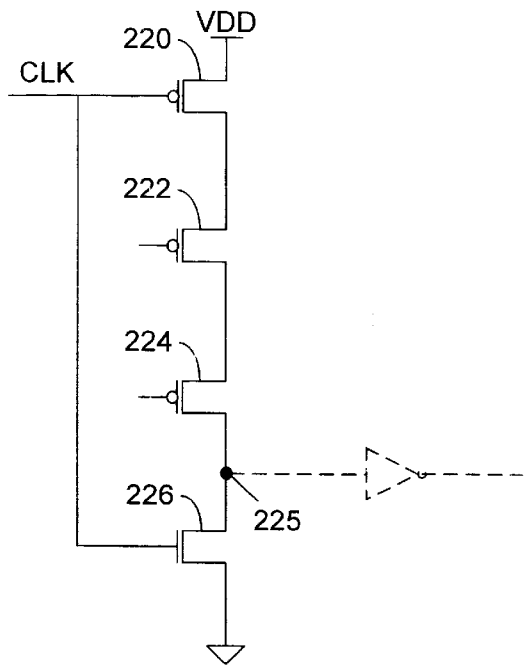

In this regard, a clock signal may be propagated through certain types of circuit configurations, while being inhibited through others. As a simple example of a circuit configuration that propagates a clock signal, consider a simple inverter element. It will be appreciated that a clock signal applied to the input of an inverter is also present at the output of the inverter. The output of the inverter, in such a configuration, carries the phase inverse of the clock signal applied to the input. To illustrate other circuit configurations, reference is now made to FIGS. 6A through 6D, which illustrate various circuit configurations that either propagate a clock, or inhibit the propagation of a clock signal. Referring first to FIG. 6A, a schematic diagram illustrates a plurality of FET devices 204, 205, 206, and 208 that are channel connected between VDD and ground. Specifically, FETs 204 and 205 are P-type FETs (or PFETs), while FETs 206 and 208 are N-type FETs (NFETs). Assuming that a clock signal is applied to the gate node of PFET 205, the present invention will identify the output, or drain node, of PFET 205 as carrying a clock signal as well. After making such an identification, the system and method of the preferred embodiment will set the clock flag within the data structure of node 209 accordingly. The manner in which the present invention makes this determination will be better appreciated from the description provided below.

In short, when propagating clock signals, the present invention operates to evaluate a given circuit element (i.e., a FET) to determine whether a clock signal is applied to the gate node of the FET. If not, then there is no clock signal to propagate. If, however, a clock signal is applied to the gate node of a FET, then the preferred embodiment of the present invention will propagate that clock signal to the output of the FET, if the output node of the FET is connected to channel nodes of both a PFET and an NFET. Having stated this general propagation criteria, however, the preferred embodiment of the present invention will inhibit the propagation of clock signals for is certain circuit configurations.

Figure 6D:
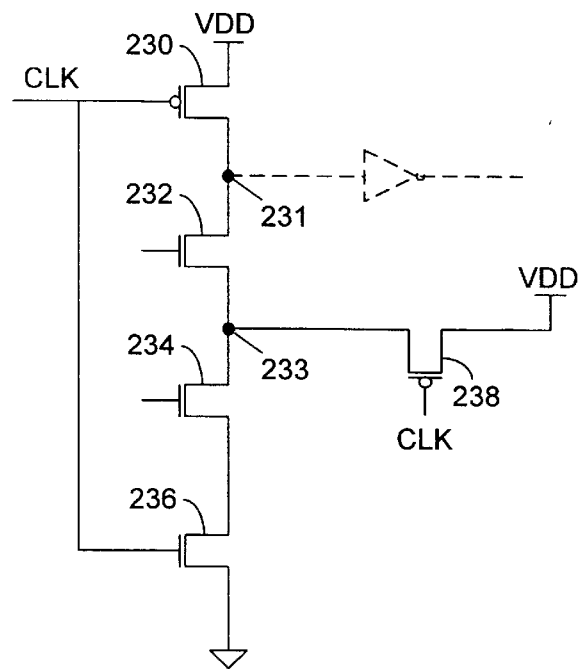
Figure 7A:
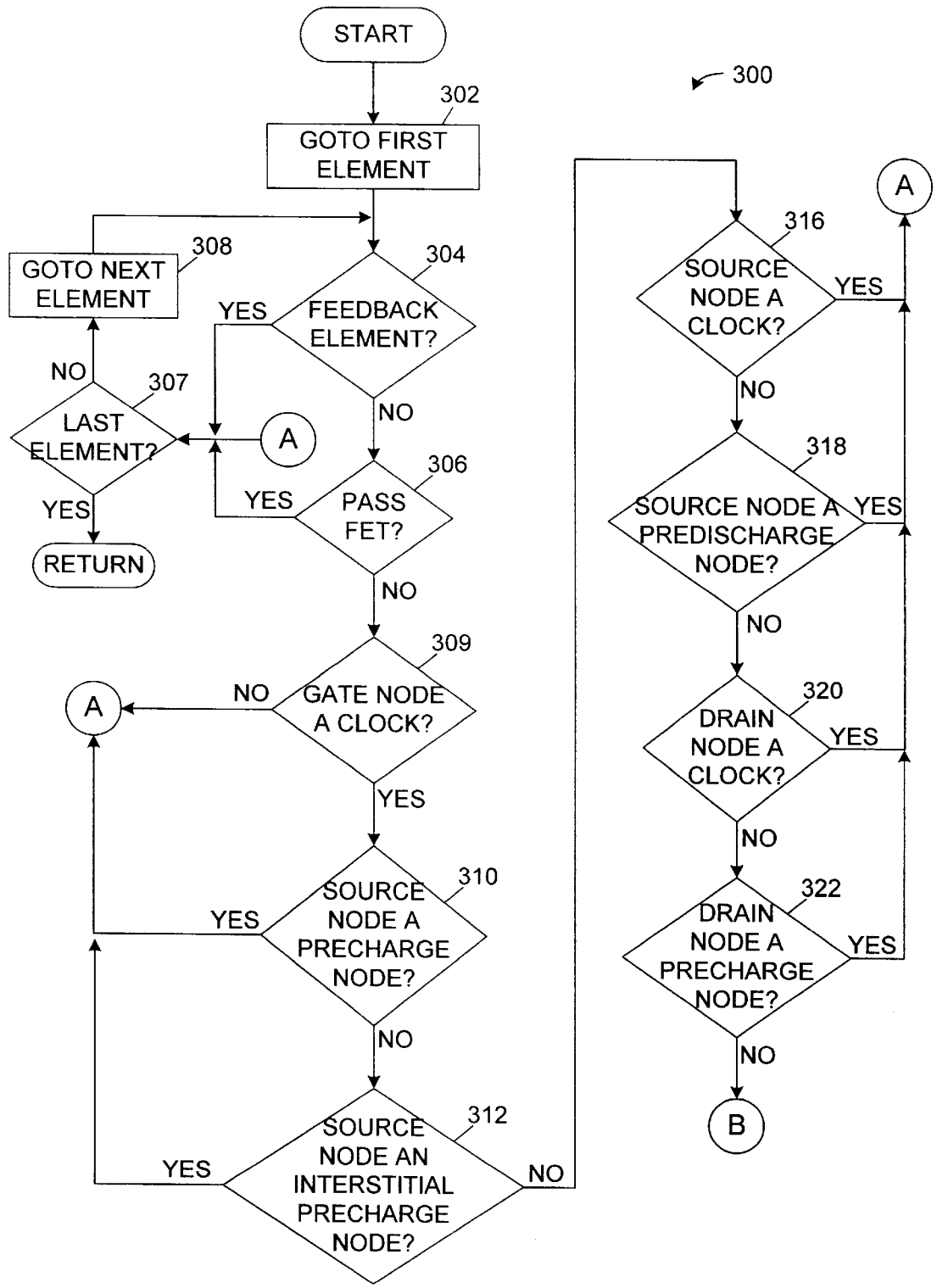
FIGS. 7A–7D collectively comprise a flow chart depicting the principal functional steps in a method constructed in accordance with one aspect of the present invention.
Figure 7B:
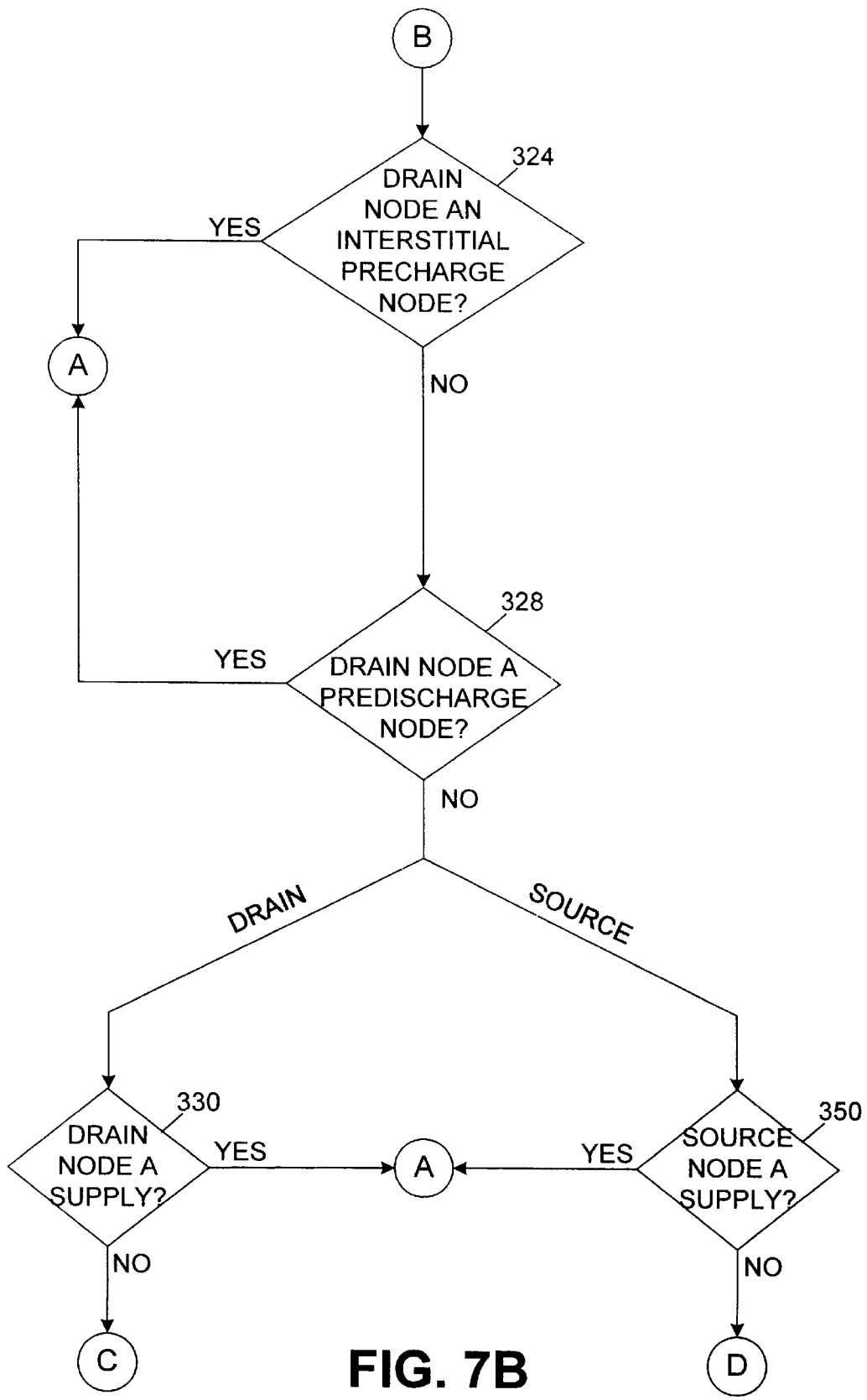
Figure 7C:
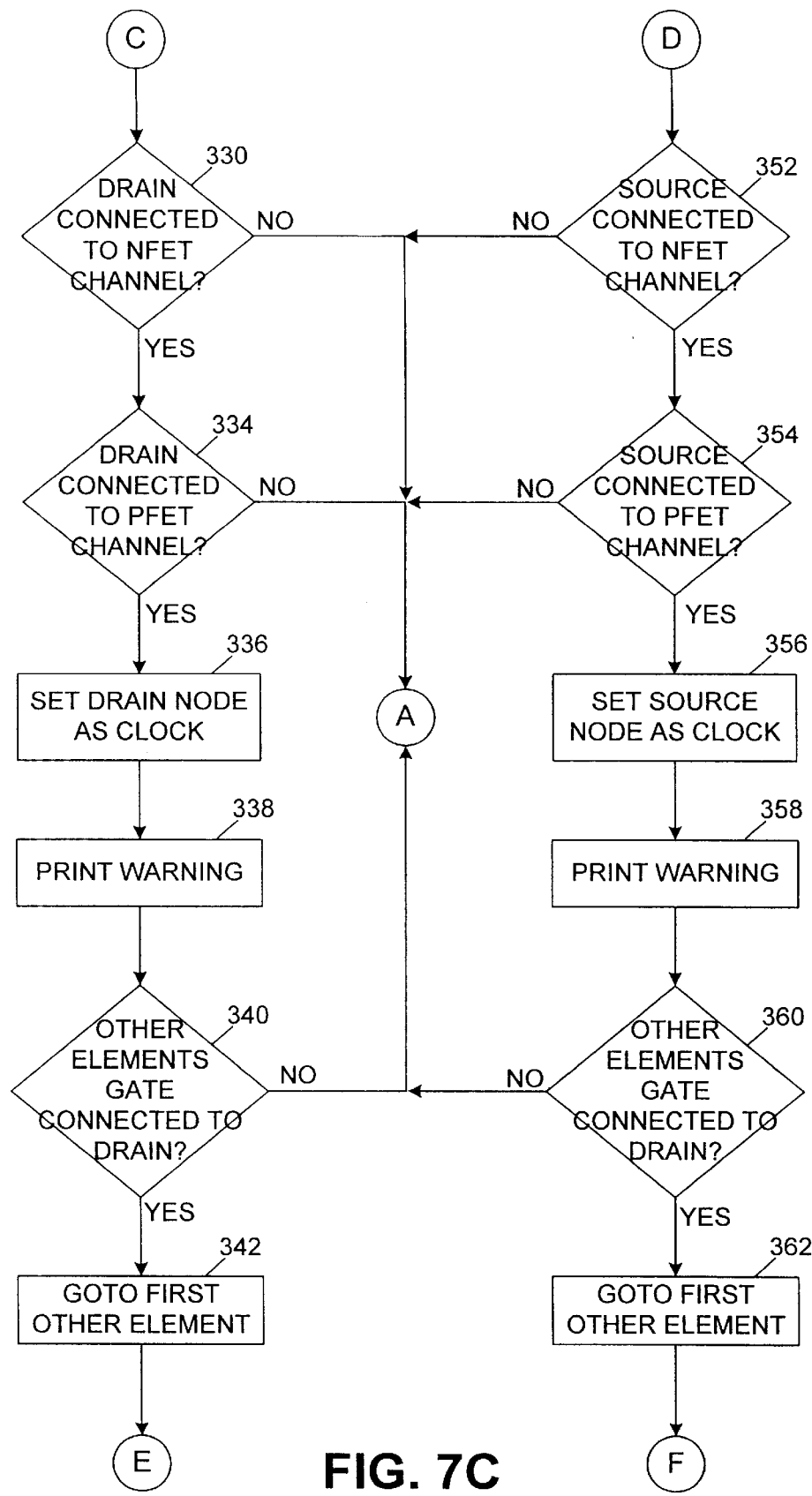
Figure 7D:
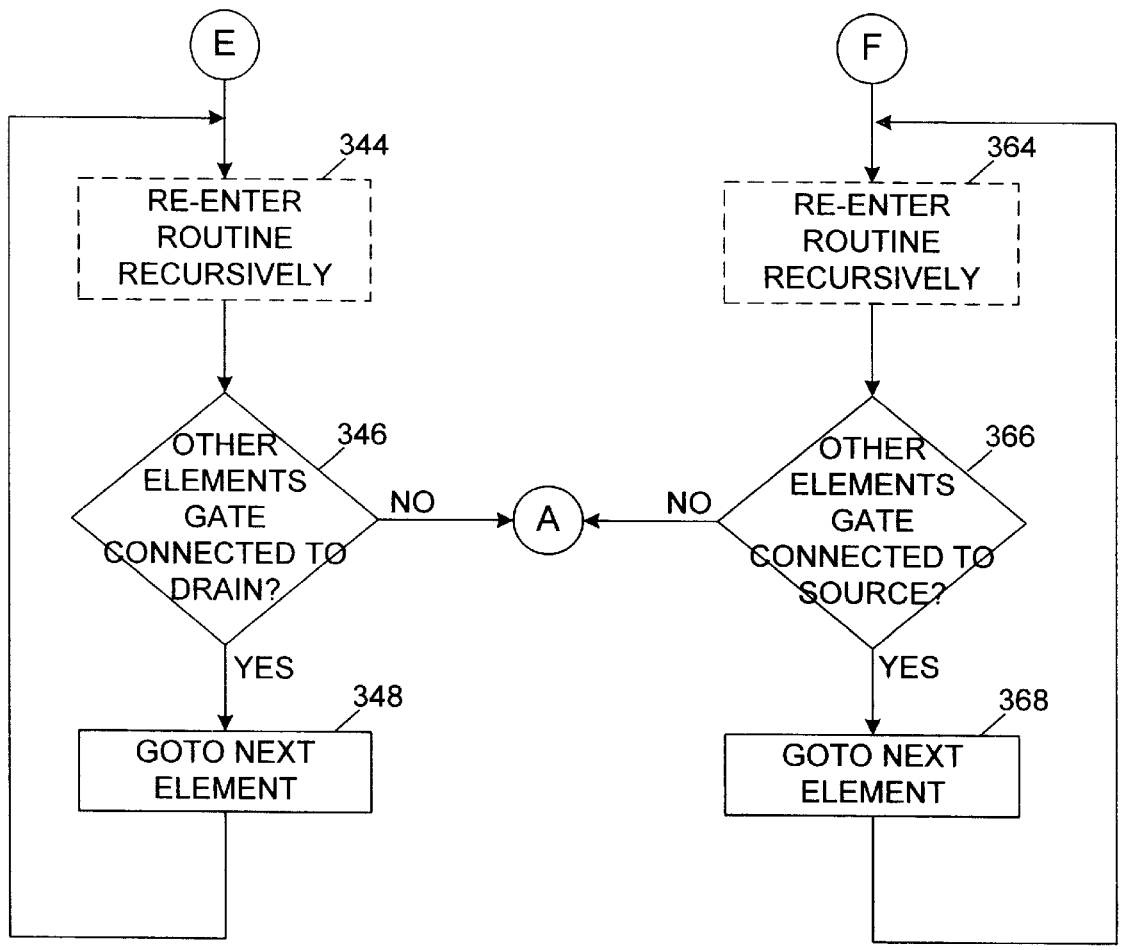

In this regard, reference is made to FIGS. 6B, 6C, and 6D, which are schematic diagrams that illustrate three different circuit configurations that are identified by the system and method of the preferred embodiment of the present invention that inhibit the propagation of a clock signal. Referring first to FIG. 6B, a plurality of FETs 210, 212, 214, and 216 are illustrated as being channel connected to ground. Specifically, FET 210 is a PFET, while the remaining FETs 212, 214, and 216 are NFETs. A clock signal is illustrated as driving the gate nodes of PFET 210 and NFET 216. As previously described, this clock signal may be predesignated by a circuit designer as being a clock signal, or may be identified and marked by PathMill or some other similar evaluation tool. PathMill may be configured to identify the node 211, which is common to the drain node of PFET 210 and source node of NFET 212 as a precharge node. Alternative, and consistent with the concepts and teachings of the invention, the system of one embodiment may be configured to make this determination. Being identified as such, the system and method of the preferred embodiment will not propagate the clock signal applied to the gate node of PFET 210 to the output of PFET 210, or node 211.

More particularly, node 211 will be identified by the preferred embodiment of the present invention as a precharge node, by identifying the surrounding circuit configuration. Specifically, the circuit configuration that defines the precharge node is one having a clock signal applied to a PFET (e.g., 210), and a plurality of NFETs channel connected between the PFET and ground. Further, the clock signal may be applied to at least one of the NFETs channel connected between the PFET and is ground, other than the NFET (e.g., 212) that is channel connected to the PFET.

Another circuit configuration identified by the preferred embodiment of the present invention as inhibiting the propagation of a clock signal is that of a predischarge node. Such a circuit configuration is illustrated in FIG. 6C. As illustrated, a circuit defining a predischarge node (e.g., node 225) includes a plurality of FETs 220, 222, 224, and 226, channel connected between VDD and ground. Like the circuit configuration of FIG. 6B, a clock signal is applied to the gate nodes of PFET 220 and NFET 226. The input signals of intervening PFETs 222 and 224 may originate from other sources. Although a clock signal drives the node of NFET 226, it will not be propagated to the output node 225 of that FET, due to the fact that the preferred embodiment will identify that output node 225 as being a predischarge node.

Another circuit configuration that is identified by the preferred embodiment of the present invention is that of an interstitial precharge node. Specifically, identifying a circuit configuration of an interstitial precharger, the preferred embodiment of the present invention will not propagate a clock signal to the output of an element, if that output node is identified as an interstitial precharge node. Referring to FIG. 6D, a schematic illustrates the circuit configuration of an interstitial precharge circuit. This circuit includes FETs 230, 232, 234, and 236 that are configured in the same manner as the FET elements of the precharge circuit illustrated in FIG. 6b. Thus, node 231 would be identified as a precharge node, and therefore the clock applied to the gate node of FET 203 would not be propagated to node 231. In addition, and as is known, in an interstitial precharger, an additional FET 238 is channel connected to node 233, and the clock signal that is applied to FET 230 is also applied to the gate node of FET 238. This circuit configuration is identified by the preferred embodiment as an interstitial precharger, and node 233 is an output node of the interstitial precharger. Thus, even though a clock signal is applied to the gate node of FET 238, and the output of FET 238 is connected to both PFET and NFET channel nodes, the clock signal is not propagated to node 233.

Although not specifically illustrated, the present invention may also inhibit the propagation of a clock signal to the output of a static gate. As illustrated in connection with FIG. 4B, one of the flags associated with the data structure of the preferred embodiment of a node in a netlist is a flag identifying whether the node is a static gate output. This information may be provided by PathMill, or may be separately determined, consistent with the broader concepts and teachings of the present invention. Therefore, the preferred embodiment of the invention may simply reference the node data structure to determine whether the node is a static gate output, and, if so, does not set the clock flag of the data structure.

Having described the principal steps of the present invention, as well as certain circuit configurations that are identified by the preferred embodiment as inhibiting the propagation of a clock signal, reference is now made to FIGS. 7A, 7B, 7C, and 7D (also collectively referred to as FIG. 7), which collectively comprise a flow chart 300 that illustrates the top-level functional operation of a method constructed in accordance with one aspect of the present invention. As previously mentioned, the method of the preferred embodiment operates to evaluate an entire netlist, or portion thereof, to propagate clock signals throughout. This propagation is preferably performed by evaluating each element within the designated portion of the netlist. Therefore, the method may operate by proceeding to a first (random) element (step 302). The method may then make various checks or determinations of that element. Specifically, and in no prescribed order, the present invention may evaluate the current element to determine whether it is a feedback element (step 304). In accordance with the preferred embodiment, a feedback element is one which does not propagate a clock signal. Therefore, if the element is determined to be a feedback element, then the output will not be propagated and the method may proceed to determine whether the current element is the last element in the designated portion of the netlist (step 307). If so, the routine may simply return to the point from where it was called. Otherwise, the routine may proceed to the next element of the designated portion of a netlist (step 308), and return to the evaluation of step 304.

If step 304 does not evaluate or determine the current element to be a feedback element, then a variety of other similar tests may be made. For example, if the current element is a pass FET then the clock signal is not propagated through the element. Therefore, the method may evaluate whether the current element is a pass FET (step 306). If so, it proceeds to step 307 as previously described. Otherwise, it proceeds to the next evaluation. One such evaluation is to determine whether a clock signal is, in fact, applied to the gate node of the current element (step 309). If not, then there is no clock signal to propagate, and the method may proceed to the evaluation of step 307, as previously described. Otherwise, the method may proceed to the next evaluation.

As illustrated in FIG. 7, additional evaluations include whether the source node of the current element is a precharge node (step 310), whether the source node of the current element is a node of an interstitial precharger (step 312), whether the source node of the current element is a clock node (step 316), and whether the source node of the current element is a predischarged node (step 318). With regard to step 316, the evaluation as to whether the source node of the current element is predefined as a clock node may be made so that the present invention does not propagate clock signals to nodes where the clock signal has already been propagated. As will be further described below, the propagation methodology of the preferred embodiment implements a recursive call to the routine of the preferred embodiment. Without an evaluation such as that of step 316, there is a possibility that the method of the preferred embodiment could end up in an infinite loop. Similar evaluations to those made in connection with the source node are also made in connection with the drain node of the current element. Therefore, the method of the preferred embodiment may evaluate the drain node of the current element to determine whether it is a clock signal (step 320), whether it is a precharge node (step 322), whether the drain node of the current element is an interstitial precharge node (step 324), and whether the drain node of the current element is a predischarge node (step 328). Assuming that all of the above-identified tests or evaluations resolve to NO, then the present invention may make parallel evaluations to both the source and drain nodes of the current element. Therefore, the method is illustrated as splitting into two parallel paths, one for the drain node and the other for the source node.

Proceeding first with the drain node path, the preferred method may evaluate the drain node of the current element to determine whether that node is channel connected to a supply (step 330). If so, then the clock signal is not propagated. If not, then the method may also determine whether the drain node is channel connected to both a PFET and an NFET (steps 332 and 334). If the drain node is connected to both a PFET and an NFET, then the preferred method will propagate the clock signal to the drain node by setting a clock flag within the data structure for that particular node of the netlist (step 336). In addition, the method may print or otherwise present a warning message to a user to indicate that the clock signal has been propagated in this manner. Therefore, such a warning message may prompt a designer of the circuit to ensure that, in fact, the clock signal should be propagated in this manner. The method may then determine whether any other elements are gate connected to the drain node of the current element (step 340). If not, the method may return to the evaluation of step 307, where it proceeds to the next element in the netlist. If, however, there are additional elements gate connected to the drain node of the current element, then the method may loop on each of these elements in turn. It may do this by proceeding to a first element (other than the current element) that is channel connected to the drain node (step 342). It may then recursively call the routine illustrated in the flow chart of FIG. 7 and make all of the foregoing evaluations on that element. It will be appreciated that this recursive reentry may be accommodated by pushing all of the registers and other interim data and "state" information to a stack, where it may be preserved. This information may later be "popped" from the stack when returning out of the recursively called routine. Thereafter, the method may evaluate whether additional elements are gate connected to the current element (step 346). If so, it proceeds to the next element (step 348) and returns to the recursive call of step 344.

Like the steps discussed above, beginning with step 330, which were made in connection with the drain node of the current element, similar evaluations may be is performed on the source node of the current FET. Specifically, the source node may be evaluated to determine whether the source node is connected to a supply (step 350). If so, the clock signal is not propagated and the method may proceed to step 306 as previously described. If not, then the method may determine whether the source node of the current FET is channel connected to both an NFET and a PFET device (step 352 and 354). If not, then the clock signal is not propagated through the current FET, and the method may return to step 307. It, however, the source node is channel connected to both a PFET and an NFET, then the clock signal is propagated through the current FET by preferably setting clock flag within the node data structure of FIG. 4B (step 356). The method may then display a warning (step 358) to a user.

Thereafter, the method may evaluate whether any other elements (other than the current FET) are gate connected to the source node of the current FET (step 360). If not, the method may proceed to step 307. Otherwise, the method loops on all other elements that are gate connected to the current FET and recursively reenters the above-described routine (steps 362, 364, 366, and 368), as described above in connection with steps 342, 344, 346, and 348.

Figure 8A:
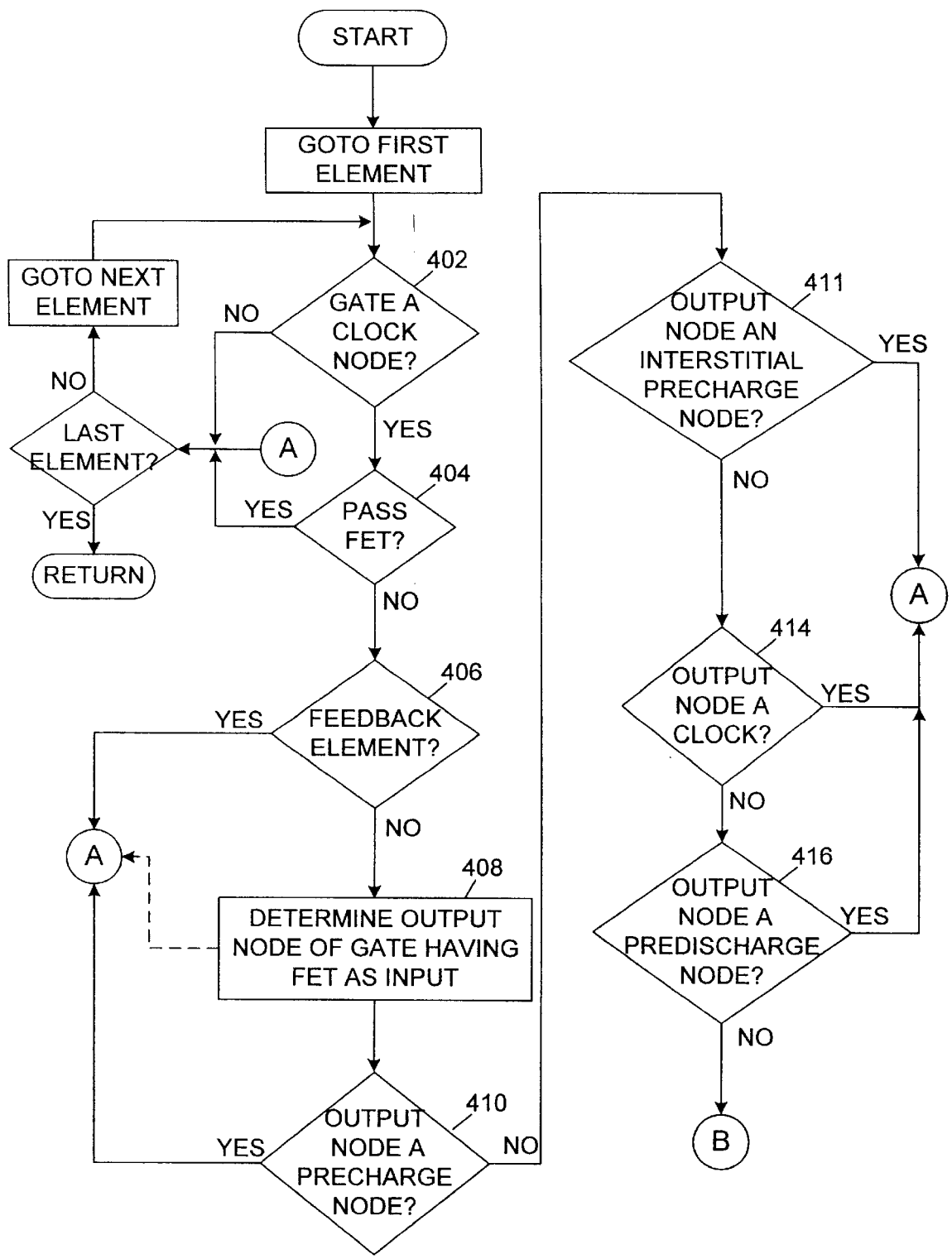
FIGS. 8A–8B collectively comprise a flow chart depicting the principal functional steps in a method constructed in accordance with another aspect of the present invention.
Figure 8B:
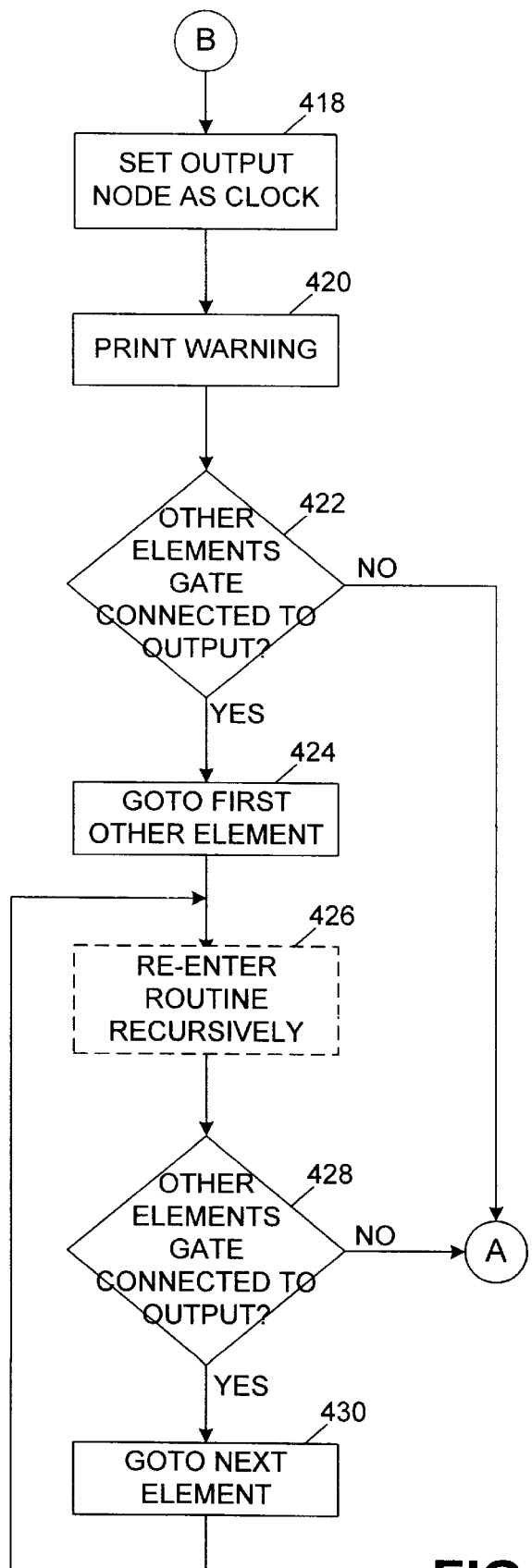

Having described one embodiment of the present invention, reference is now made to FIGS. 8A and 8B (also collectively referred to as FIG. 8), which collectively comprise a flow chart 400 describing a similar, but alternative embodiment of the present invention. In short, the method of the embodiment of FIG. 8 operates similar to the method of the embodiment illustrated in FIG. 7. However, instead of making separate evaluations for both source and drain nodes of a current FET element, the method of FIG. 8 first determines an output node for a logic gate having the current FET as an input, and evaluates that output node. More specifically, the method of FIG. 8 for a given FET element, may evaluate the gate node of the FET element to determine whether a clock signal is applied to the gate node (step 402). If not, then the method may proceed to the next element in the netlist. If a clock signal is applied to the gate node, then the method may determine whether the element is a pass FET (step 404). If so, then the method determines whether the element is a feedback element (step 406). If not, then the method may proceed to step 408, where it determines the output node of the current FET element.

Consistent with the broader concepts of the present invention, this step may be executed in a variety of ways. In one embodiment of the invention, this step may evaluate surrounding circuit components to determine whether the current FET element is an input to a logic gate (eg., AND gate, OR gate, invertor, etc.). If not, then no clock propagation is performed (as represented by the dashed line leading from step 408 to the circle labeled as "A"). If step 408 identifies the current FET element as being an input to a logic gate, then the step identifies the output node of that logic gate, and the invention may make various evaluations of the output node.

Specifically, once the output node has been identified, the method may proceed by evaluating the output node to determine whether this node is a precharge node (step 410). If so, then the clock signal is not propagated through the element. If so, the method then evaluates the output node to determine whether it is an interstitial precharge node (step 411). If not, then the method may evaluate the output node to determine whether it has been preidentified or marked as a clock signal (step 414). If not, then the method may evaluate the output node to determine whether it is a predischarge node. If any of the above-tests of steps 410 through 416 resolve to YES, then the clock signal is not propagated through the current FET element, and the method may proceed to the next element in the netlist. Otherwise, the method propagates the clock signal applied to the gate node of the current FET element to the output node of the FET element (step 418) by, for example, setting a flag in the node data structure (see FIG. 4b). The method may then print a warning (step 420) to a user that the clock signal has been propagated to this new node. Thereafter, the method may proceed in the same fashion as described in connection with FIG. 7.

More specifically, the method may determine whether other FET elements are gate connected to the output node of the logic gate of the current FET (step 422). If so, the method may then loop on these elements and recursively reenter the routine for all elements that are gate connected to the output node of the logic gate (step 424, 426, 428, and 430).

While the invention has been described above in connection with a method for evaluating a netlist, it will be appreciated that, in accordance with another aspect of the invention, a system may also be provided. Preferably, the system will be provided, in part, in the form of a computer readable storage medium that is configured to execute on a computer having a processor.

Figure 9:
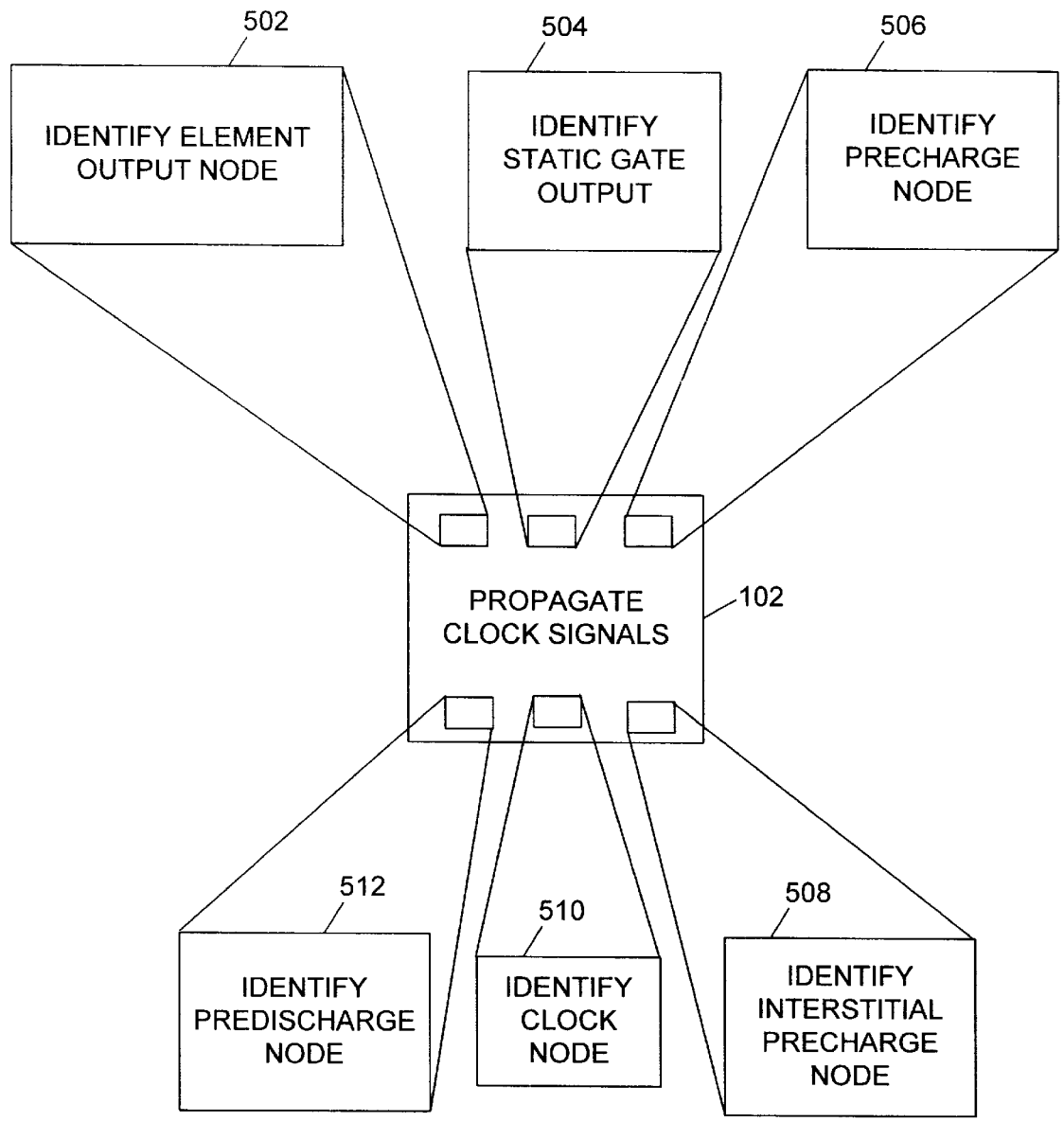
FIG. 9 is a block diagram illustrating certain fundamental code segments comprising a system constructed in accordance with the invention.

In this regard, reference is now made to FIG. 9 which illustrates certain functions which may be carried out by a system that is configured to evaluate a circuit netlist for errors, constructed in accordance with the teachings of the invention. For example, the system may include a plurality of code segments that perform a variety of individual functions. For example, one segment 502 may be configured to identify the output node of a circuit element. Another segment 504 may be configured to identify a node as a static gate output. Another segment 506 may be configured to identify a circuit configuration of a precharge node, as well as an interterstitial precharge node (segment 508). Yet another segment 510 may be configured to identify an input clock node. Still another segment 512 may be configured to identify a circuit configuration of a predischarge node. Yet additional segments (not illustrated) may be provided in connection with the system of the present invention. As will be appreciated by persons of skill in the art in light of the teachings provided herein.

In should be appreciated that the flow charts of FIGS. 3, 7, and 8 show the top-level operation of only one possible implementation of the methods of the present invention. In this regard, each block represents a module, segment, or portion of code, which comprises one or more executable instructions for implementing the specified logical function (s). It should also be noted that in some alternative implementations, the functions noted in the blocks may occur out of the order noted in FIGS. 3, 7, and 8. For example, two blocks shown in succession may in fact be executed substantially concurrently or the blocks may sometimes be executed in the reverse order, depending upon the functionality involved.

The foregoing description is not intended to be exhaustive or to limit the invention to the precise forms disclosed. Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. AU such modifications and variations are within the scope of the invention as determined by the appended claims when interpreted in accordance with the breadth to which they are fairly and legally entitled.

What is claimed is:

1. A method for evaluating a netlist and propagating clock signals throughout the netlist, the method comprising the steps of:

evaluating an element of the netlist;

ensuring that a gate node of the element is defined as a clock node;

ensuring that a drain node of the element is not a precharge node;

ensuring that the drain node of the element is not a predischarge node;

ensuring that a source node of the element is not a precharge node; and ensuring that the source node of the element is not a predischarge node.

2. The method as defined in claim 1, further including the step of ensuring that the source node of the element is not a supply node.

3. The method as defined in claim 2, further including the step of ensuring that the source node of the element is channel connected to both an NFT and a PFET.

4. The method as defined in claim 3, further including the step of marking the source node as a clock node.

5. The method as defined in claim 4, further including the step evaluating another element that is gate connected to the source node, and repeating the steps of claim 1 on the another element.

6. A method for evaluating a netlist and propagating clock signals throughout the netlist, the method comprising the steps of:

evaluating an element of the netlist;

determining that the element is an input to a logic gate;

determining an output node of the logic gate;

ensuring that the output node is not a precharge node; and ensuring that the output node of the element is not a predischarge node.

7. The method as defined in claim 6, further including the step of ensuring that the output node is not a clock node.

8. The method as defined in claim 6, further including the step of ensuring that the output node of the element is not a supply node.

9. The method as defined in claim 8, further including the step of ensuring that the output node of the element is channel connected to both an NFET and a PFET.

10. The method as defined in claim 9, further including the step of marking the output node as a clock node.

11. The method as defined in claim 10, further including the step evaluating another element that is gate connected to the output node, and repeating the steps of claim 10 on the another element.

12. A method for evaluating a netlist and propagating clock signals throughout the netlist, the method comprising the steps of:

(a) evaluating an element of the netlist;

(b) ensuring that a gate node of the element is defined as a clock node;

(c) determining whether a first channel node of the element is a clock node;

(d) determining whether a clock signal on the gate node should be propagated to the first channel node of the element;

(e) marking the first channel node as a clock node; and (f) evaluating another element that is gate connected to the first channel node, and repeating steps (a) through (f) on the another element.

13. The method as defined in claim 12, further including the step of ensuring that the first channel node of the element is not a precharge node.

14. The method as defined in claim 12, further including the step of ensuring that the first channel node of the element is not a predischarge node.

15. A method for evaluating a netlist and propagating clock signals throughout the netlist, the method comprising:

evaluating an element of the netlist;

ensuring that a gate node of the element is defined as a clock node;

evaluating elements in the netlist that surround the element to ensure that the element will operate to propagate the clock on the gate node.

16. The method as defined in claim 15, wherein the step of evaluating elements in the netlist more specifically performs at least one step from the group consisting of: ensuring that a drain node of the element is not a precharge node, ensuring that the drain node of the element is not a predischarge node, ensuring that a source node of the element is not a precharge node, ensuring that the source node of the element is not a predischarge node, ensuring that the source node of the element is channel connected to both an NFET and a PFET, and ensuring that the source node of the element is not a supply node.

* * * * *